United States Patent [19]
Carley

[11] Patent Number: 5,814,845
[45] Date of Patent: Sep. 29, 1998

[54] FOUR RAIL CIRCUIT ARCHITECTURE FOR ULTRA-LOW POWER AND VOLTAGE CMOS CIRCUIT DESIGN

[75] Inventor: L. Richard Carley, Pittsburgh, Pa.

[73] Assignee: Carnegie Mellon University, Pittsburgh, Pa.

[21] Appl. No.: 669,518

[22] PCT Filed: Jan. 10, 1995

[86] PCT No.: PCT/US95/00295

§ 371 Date: Jul. 10, 1996

§ 102(e) Date: Jul. 10, 1996

[87] PCT Pub. No.: WO95/19046

PCT Pub. Date: Jul. 13, 1995

[51] Int. Cl.⁶ .................................................... H01L 27/02
[52] U.S. Cl. ........................................... 257/207; 257/206
[58] Field of Search .................................... 257/369, 377, 257/206, 207, 208

[56] References Cited

U.S. PATENT DOCUMENTS

| | | |
|---|---|---|
| 4,920,284 | 4/1990 | Denda . |
| 4,977,335 | 12/1990 | Ogowa . |
| 5,196,743 | 3/1993 | Brooks . |
| 5,206,544 | 4/1993 | Chen et al. . |
| 5,218,247 | 6/1993 | Ito et al. . |
| 5,266,848 | 11/1993 | Nakagome et al. . |
| 5,315,173 | 5/1994 | Lee et al. . |
| 5,442,218 | 8/1995 | Seider et al. ............................. 257/207 |
| 5,448,526 | 9/1995 | Horiguchi et al. . |

FOREIGN PATENT DOCUMENTS

| | | |
|---|---|---|
| A0 116 820 | 8/1984 | European Pat. Off. . |
| 0 381 237 A3 | 8/1990 | European Pat. Off. . |
| A2 073 519 | 10/1981 | United Kingdom . |
| WOA86 02201 | 4/1986 | WIPO . |

OTHER PUBLICATIONS

Shin–ichiro Mutoh, et al., "1V High–Speed Digital Circuit Technology With 0.5 μm Multi–Threshold CMOS", *ASIC Conf.* 1993, pp. 186–189.

Anantha P. Chandrakasan, et al., "Low–Power CMOS Digital Design", *IEEE Journal of Solid State Circuits*, vol. 27, No. 4, Apr. 1992, pp. 473–484.

James B. Burr, "Stanford Ultra Low Power CMOS", *Hot Chips Symposium V*, Aug. 10, 1993, Standord, CA, pp. 7.4.1—8.1.9.

Yoshinobu Nakagome, "Sub–1–V Swing Internal Bus Architecture for Future Low–Power ULSI's", *IEEE Journal of Solid-State Circuits*, vol. 28, No. 4, Apr. 1993, pp. 414–419.

*Primary Examiner*—David B. Hardy
*Attorney, Agent, or Firm*—Kirkpatrick & Lockhart LLP

[57] ABSTRACT

A circuit architecture is disclosed wherein power is supplied to a CMOS circuit through a first pair of voltage rails, including a first voltage rail (12) providing a first voltage and a second voltage rail (14) providing a second voltage, and a second pair of voltage rails, including a third voltage rail (16) providing a third voltage and a fourth voltage rail (18) providing a fourth voltage. Components (20, 22) comprising two circuit portions are connected across either the first or second pair of voltage rails. The voltage difference across each pair of voltage rails is less than the threshold voltage of the groups of component (20, 22) so that very little current is drawn. Because the voltage offset between the first and second pairs of rails is greater than the threshold voltage of the groups of components (20, 22), sufficient voltage is provided for switching. Circuitry may be provided for monitoring the voltage of one of the rails to insure that its value provides the proper off current and for biasing both the substrate and wells to compensate for variations amongst components. The four rail architecture of the present invention may be combined with a Class B output buffer or the four rail circuit itself may be designed as a Class B circuit to reduce power consumption.

12 Claims, 6 Drawing Sheets

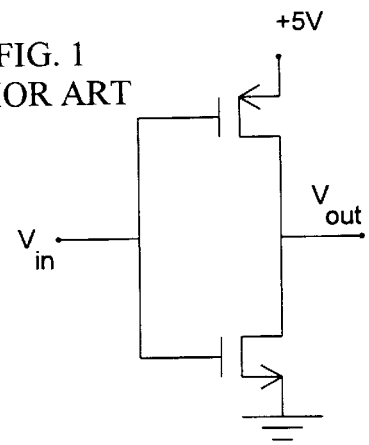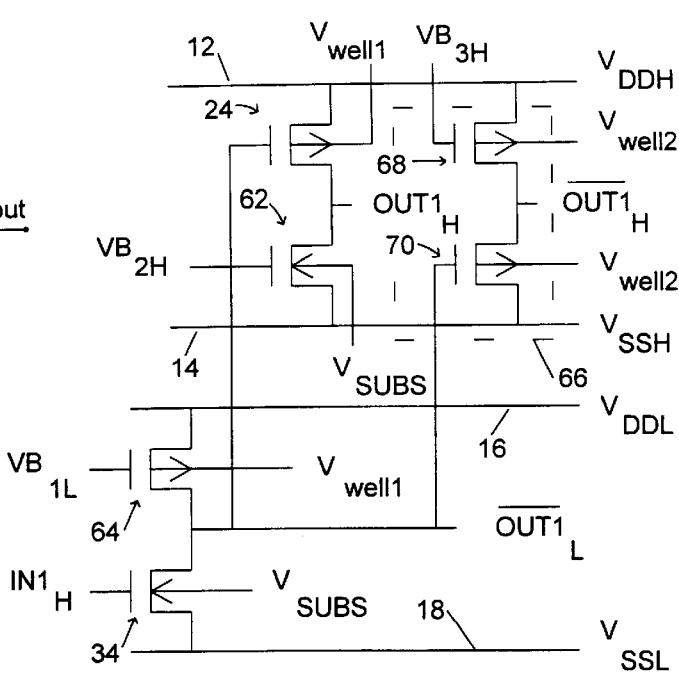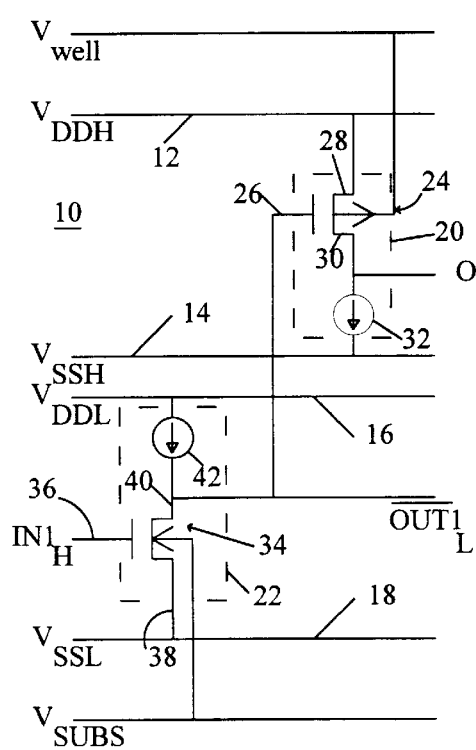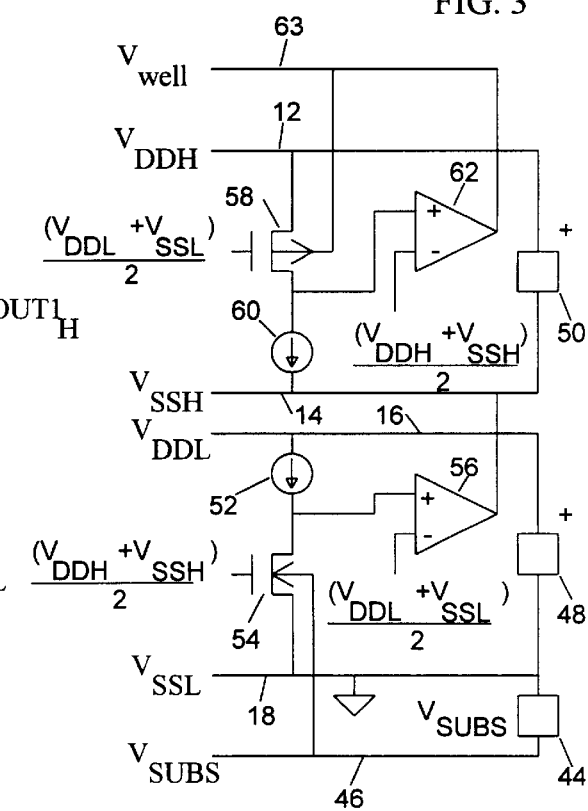

FOUR RAIL CIRCUIT ARCHITECTURE FOR ULTRA-LOW POWER AND VOLTAGE CMOS CIRCUIT DESIGN

BACKGROUND OF THE INVENTION

1. Field of the Invention

The present invention is related to low power consumption circuit architectures and, more specifically, to a circuit architecture for the design of ultra-low power consumption CMOS circuits.

2. Description of the Background of the Invention

Many sophisticated and powerful portable computation and communication devices are currently available. Because such devices are powered by batteries, their endurance between battery charges is limited by the power consumption of the on-board circuits. Thus, power dissipation, rather than the number of transistors or other components, will likely be the key limitation on the signal processing capability of future integrated circuits for portable applications.

The development of economical complimentary metal-oxide semiconductor (CMOS) fabrication techniques was a substantial breakthrough in lowering power requirements. CMOS techniques result in both n-channel and p-channel transistors being fabricated on the same chip. The use of an inverter stage of the type shown in FIG. 1, which is the central idea for other CMOS logic gates, has resulted in some very low-power-drain logic circuitry. As seen in FIG. 1, at any given time, only the upper side (p-channel) or the lower side (n-channel) is on. Thus, there is very little DC current flow from the power source $V_{CC}$ to ground. The reason there is some current flow is that both transistors are on during a small portion of the input voltage's transitions. Also, stray capacitances are charged from the power supply voltage source and then discharged to ground when the output changes state. Power drain ($P_D$) can be estimated by using the following relation:

$$P_d = (C_{pd} + C_L)(V_{CC})^2 (f_{clk}) + (V_{CC})(I_1)$$

where $C_{pd}$=equivalent power dissipation capacitance value (from data sheets)

$V_{CC}$=power-supply voltage $I_1$=leakage current $C_L$=external load capacitance at the output $f_{clk}$=clock frequency As seen from the foregoing equation, when the leakage current is negligible, as is usually the case, the power drain varies as the square of the power supply voltage. Accordingly, reducing the power supply voltage from, for example, 5 volts to 2 volts reduces the power drain as $5^2$ to $2^2$, or roughly 6 to 1. Thus, voltage scaling has been seriously investigated as a way to reduce power consumption.

For both analog and digital circuits, reducing the power supply voltage is a straight-forward method of decreasing the power requirements. There are, however, several barriers which have prevented the power supply voltages of digital logic circuits from being scaled down to 0.5 volts or lower. For example, there are several fabrication/manufacturing issues that limit how much power supply voltage can be reduced. A primary fabrication/manufacturing issue is that there are substantial variations in the threshold voltage $V_T$ between devices, both systemic variations and random fluctuations. The systemic variations are currently dominant and are contributed to by a large number of factors related to the semiconductor manufacturer's equipment. For a one micron process using six inch (15.24 cm) wafers, one of the primary problems is variation in the poly linewidth defining the effective gate length of the transistors due to variations in the optics across the reticle field. That results in peak-to-peak variations of up to 0.2 volts in the threshold voltage across the reticle. It is expected that the variations in the threshold voltage will be even larger as the gate length decreases to the 0.5 micron level and below.

Additionally, the use of large wafers (e.g. 8 inch (20.32 cm) wafers) results in a further increase in the variations in the threshold voltage due to spacial inhomogeneities in the manufacturing equipment. With a one centimeter by one centimeter die, the systemic variations are smaller, resulting in peak-to-peak variations of roughly 50 millivolts for a one micron process using six inch (15.24 cm) wafers.

There are also variations in threshold voltage from one lot to the next that account for roughly another 0.2 volts of peak-to-peak variation. For example, the MOSIS wafer acceptance range for Orbit p-well and n-well two micron process is greater than 0.5 volts and less than one volt, which is even worse than the 0.4 volt peak-to-peak range for the one micron process mentioned above because the whole wafer mask is used rather than reticles. However, the larger variations in threshold voltage for the whole wafer mask indicates what can be expected as the gate lengths continue to shrink relative to the reticle size. Additional variations in threshold voltage occur as the device's operating temperature changes.

A further barrier to voltage scaling is that the threshold voltage of devices would have to be adjusted to each different range on the speed/power tradeoff curve.

Because of the tremendous economic burden required to modify a fabrication process, qualify the modified process, and track variations in the modified process, each application must "pay" for the overhead of developing and maintaining its own specialized fabrication process. It is unlikely that product niches, such as ultra-low voltage and power systems will justify the expense of process development in the near term. Thus, the need exists for a system architecture which enables power supply voltages to approach theoretical values while at the same time enables circuits employing that architecture to be fabricated using standard CMOS fabrication techniques.

SUMMARY OF THE PRESENT INVENTION

The present invention is directed to a system architecture which allows the voltage supplied to an analog or digital CMOS circuit to approach the theoretical minimum value. The architecture, when employed to design a CMOS circuit, results in a circuit that comprises a first pair of voltage rails including a first voltage rail providing a first voltage and a second voltage rail providing a second voltage. A plurality of components is connected across the first pair of rails and at least one of the components has a gate terminal, a source terminal, and a first threshold voltage. The circuit also comprises a second pair of voltage rails including a third voltage rail providing a third voltage and a fourth voltage rail providing a fourth voltage. A second plurality of components is connected across the second pair of voltage rails and at least one of the components has a gate terminal, a source terminal, and a second threshold voltage. In general, sources and drains of MOS transistors, between which DC current flows, are connected between either the first and second voltage rails or the second and third voltage rails while gates, which cannot conduct DC current, may be connected to other potentials.

The voltage difference across each of the pairs of rails, where DC current flows, is small, below the threshold values of the components, so that power consumption is kept at a minimum. The voltage difference across the first and fourth rails, across which very little DC current flows, is a first value which is greater than the first and second threshold voltages while the voltage difference across the second and fourth rails is a second value which is less than the first and second threshold voltages. A plurality of conductors interconnects the first and second pluralities of components to form the circuit and to allow the gate to source voltage of each component to swing between the first and second values.

Circuitry may be provided for monitoring the second voltage to insure that its value provides the proper off current and to bias both the substrate and wells to compensate for variations in $V_{TN}$ and $V_{TP}$. The architecture of the present invention may be employed at the die-level, or the die may be divided into smaller regions.

Circuits utilizing the architecture of the present invention, in addition to allowing ultra low power and ultra low voltage operation, can be fabricated using standard, commercially available, CMOS fabrication techniques. Additionally, circuits constructed according to the present invention can be operated across a wide range of points on the speed-power curve simply by adjusting the internal power supply and certain bias voltages. Furthermore, circuits constructed using the techniques of the present invention may be coupled with Class B output buffers to further reduce power consumption. I also disclose a methodology for modifying the circuit architecture of the present invention so that the resulting circuits are Class B circuits. Those and other advantages and benefits of the present invention will be apparent from the Description Of A Preferred Embodiment hereinbelow.

BRIEF DESCRIPTION OF THE DRAWINGS

For the present invention to be easily understood and readily practiced, preferred embodiments will now be described, for purposes of illustration only, in conjunction with the following figures wherein:

FIG. 1 is an electrical schematic of a prior art CMOS inverter;

FIG. 2 is an electrical schematic of a pair of inverters constructed according to the teachings of the present invention;

FIG. 3 is an electrical schematic of the circuitry necessary to control the rail voltages and to produce the bias voltages required in the circuit of FIG. 2;

FIG. 4 is an electrical schematic of the inverter shown in FIG. 2 including a follower circuit;

DESCRIPTION OF A PREFERRED EMBODIMENT

Figure 5:
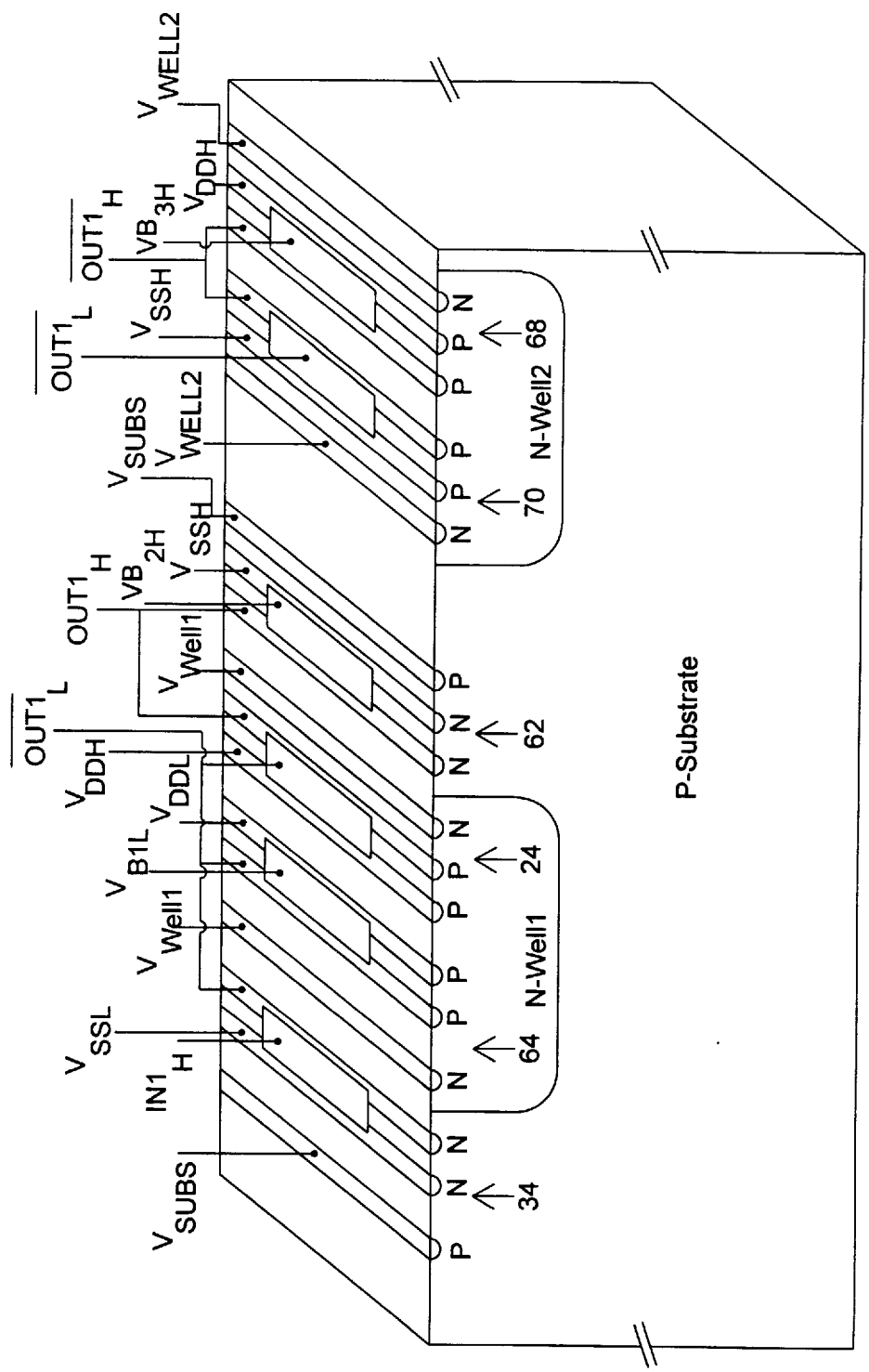
FIG. 5 is a diagram of the physical representation of the circuit illustrated in FIG. 4.

Illustrated in FIG. 2 is an electrical schematic of two types of inverters 10 constructed utilizing the circuit architecture of the present invention. As is apparent from FIG. 2, the circuit architecture of the present invention differs markedly from prior art circuit architectures in which only two conductors, or rails, are provided for supplying voltage from the power supply. In the architecture of the present invention, a first voltage rail 12 carries a voltage $V_{DDH}$, a second voltage rail 14 carries a voltage $V_{SSH}$, a third voltage rail 16 carries a voltage $V_{DDL}$, and a fourth voltage rail 18 carries a voltage $V_{SSL}$. While the present invention is described in conjunction with the inverters 10 of FIG. 2, it should be understood by the reader that the four rail architecture disclosed herein can be used with a variety of circuits. An inverter has been picked for purposes of illustration because the inverter is a fundamental component of more complex logic gates and amplifiers.

In FIG. 2, it is seen that a first group of components 20 is connected across the first pair of rails 12 and 14 while a second group of components 22 is connected across the second pair of rails 16 and 18. The components comprising the first group of components 20 may include a PMOS transistor 24 having a gate terminal 26, a source terminal 28, and a drain terminal 30. The drain terminal 30 is connected to a constant current source 32. The second group of components 22 may similarly be comprised of an NMOS transistor 34 having a gate terminal 36, a source terminal 38, and a drain terminal 40. The drain terminal 40 is connected to a constant current source 42.

It is seen that the first group of components 20 is connected across voltages $V_{DDH}$ and $V_{SSH}$. The difference between those voltages is less than the threshold voltage of transistor 24. As used herein, threshold voltage is defined as that point at which the MOS transistor conducts a drain current greater than a specified value. That specified value may, for example, be anywhere from $10^{-6}$ to $10^{-9}$ amps.

Similarly, the second group of components 22 is connected across voltages $V_{DDL}$ and $V_{SSL}$. The difference between those voltages is less than the threshold voltage of the transistor 34.

The difference between one of the voltages carried by the first pair of rails 12 and 14 and one of the voltages carried by the second pair of rails 16 and 18 is greater than the threshold voltage of both transistors 24 and 34. For example, the difference between $V_{DDH}$ and $V_{SSL}$ is greater than the threshold voltages of both transistors 24 and 34. Because the first group of components 20 is connected across the first pair of rails 12 and 14, and the voltage difference across those rails is less than the threshold voltage, very little power is consumed by the first group of components. In a similar fashion, because the second group of components 22 is connected across the second pair of rails 16 and 18, and because the voltage difference across those rails is less than the threshold voltage of transistor 34, very little power is consumed. However, because the voltage difference between the pairs of rails is set greater than the threshold voltage, as described more fully below, the components are provided with sufficient voltage to switch between their on and off states.

In an ideal situation, where the threshold voltages of the transistors are equal, and are known, the voltages carried by the rails may be supplied by fixed power supplies, such as batteries. However, in the real world, it is likely that there will be substantial variations in threshold voltages between n-type and p-type transistors, as well as variations in threshold voltages amongst n-type transistors and p-type transistors. Additionally, threshold voltages may change over time or as a result of changes in temperature. Accordingly, it becomes necessary to monitor at least some of the voltages carried by the rails 12, 14, 16, and 18 as well as to back bias the substrate and wells carrying the transistors. The circuitry necessary for monitoring the supply voltages and for generating the bias voltages is illustrated in detail in FIG. 3.

Turning to FIG. 3, back biasing of the substrate is accomplished by a floating power supply 44 connected to the substrate via a conductor 46. Although a floating power supply 44 is provided, in fact, once substrate voltage $V_{SUBS}$ is chosen, it remains substantially fixed. Accordingly, it may be more appropriate to refer to power supply 44 as an adjustable power supply. One reason for back biasing the substrate is that it guarantees that the threshold voltages can be matched with $V_{WELL}$ above the value of the voltage $V_{DDH}$. In fact, because we also want to substantially reverse bias the PMOS junction capacitances to decrease their values as well, we would like to place a large back bias on the substrate, e.g. $V_{SUBS}=V_{SSL}-3$ volts.

Typical values which may be used in the circuit shown in FIG. 3 may include $V_{SSL}$ set to ground potential. With $V_{SSL}$ set at ground potential, $V_{SUBS}$ is set at −3 volts. We want the voltage difference across rails 16 and 18 to be small, e.g. 0.25 volts, which is set by a floating power supply 48 connected across conductors 16 and 18. We now have voltages for $V_{DDL}$, $V_{SSL}$, and $V_{SUBS}$. We can select the value for the difference in voltage carried by rails 12 and 14. For example, we may select $V_{DDH}-V_{SSH}$ equal to $V_{DDH}-V_{SSL}$, e.g. 0.25 volts. And we also know that the voltage difference between first rail 12 and fourth rail 18 must be greater than the threshold voltages of the devices and that $V_{WELL}$ must be greater than $V_{DDH}$. With that information, it is possible to determine the remaining two voltages $V_{SSH}$ and $V_{WELL}$.

$V_{SSH}-V_{SSL}$ determines the off current flowing through NMOS input transistor 34. Where $V_{SSL}$ is 0. $V_{SSH}$ determines the off current. A typical value for $V_{SSH}-V_{SSL}$ is approximately 1 volt. One of the benefits of the four rail architecture of the present invention is that the value $V_{SSH}-V_{SSL}$ may be adjusted to make up for variations in the threshold voltages of the n-type devices. In essence, the value of $V_{SSH}$ is allowed to float to compensate for $V_{TN}$. A floating power supply 50 is provided across rails 12 and 14 so as to apply approximately 1.25 volts to rail 12 and one volt to rail 14. However, rail 14 is also connected to a negative feedback loop comprised of a constant current source 52 and NMOS transistor 54 connected across rails 16 and 18. NMOS transistor 54 is constructed such that its $V_{TN}$ is a good match to that of the many transistors like 34. Similarly transistor 58 matches transistor 20, transistor 52 matches transistor 42, and transistor 32 matches transistor 60. The transistor 54 receives a signal at its gate terminal which is representative of the midpoint between the voltages carried by rails 12 and 14, i.e., $(V_{DDH}+V_{SSH})/2$. The output of the transistor 54 is connected to a noninverting input terminal of an operational amplifier 56. An inverting input terminal of the operational amplifier 56 receives a voltage representative of the midpoint of the voltages carried by rails 16 and 18, i.e., $(V_{DDL}+V_{SSL})/2$. An output terminal of the operational amplifier 56 is connected to rail 14. Because of the negative feedback loop comprised of current source 52, transistor 54, and operational amplifier 56, $V_{SSH}$ is allowed to float to precisely compensate for the value of $V_{TN}$.

The threshold of transistor 34 $V_{TNS}$ will likely be fairly large because several volts of negative bias are being applied to the substrate to decrease the junction capacitances of the n-type devices. As seen, however, the exact value of $V_{SSH}-V_{SSL}$ is derived from the feedback loop comprised of current source 52, transistor 54, and operational amplifier 56 which determine the necessary difference to achieve a desired mid-point (half way between "on" and "off") current level for transistor 34. The on current level is the current through transistor 34 when its gate to source voltage $V_{GS}$ is at $V_{DDH}-V_{SSL}$. It is typical, but not necessary, that $V_{DDH}-V_{SSH}=V_{DDL}-V_{SSL}$. The exact opposite is true for the PMOS input gate 24. In that case, the off current is given by the current through the PMOS transistor 24 with $V_{GS}=V_{DDL}-V_{DDH}$ and its on current is determined by $V_{GS}=V_{SSL}-V_{DDH}$. Because the same voltage difference determines the off current for the NMOS and PMOS devices, this circuit will work correctly when $V_{TN}=V_{TP}$. We force that to happen through the use of a feedback loop which adjusts the value of $V_{WELL}$ until the threshold of the n-type devices and the p-type devices match. As previously stated, that is another reason for back biasing the substrate—to ensure that $V_{TS}$ can be matched with $V_{WELL}$ above $V_{DDH}$.

The feedback loop for adjusting $V_{WELL}$ is illustrated in FIG. 3 and is comprised of a transistor 58 connected in series with a current source 60 across rails 12 and 14. The transistor 58 receives at its gate terminal a signal representative of the midpoint in the voltage across rails 16 and 18, i.e., $(V_{DDL}+V_{SSL})/2$. The output of the transistor 58 is input to a noninverting input terminal of an operational amplifier 62. An inverting input terminal of the operational amplifier 62 receives a voltage representative of the midpoint in the voltages across rails 12 and 14 i.e., $(V_{DDH}+V_{SSH})/2$. The voltage $V_{WELL}$ available at an output terminal of the operational amplifier 62 is connected to the well through a conductor 63.

The proposed architecture is able to offset the nominal value of $V_T$ of each component and nearly all of the variation in $V_T$. Although the control of $V_T$ could also be addressed by varying the nominal value of $V_T$ during the manufacturing process and by attempting to impose much more stringent limitations on its variance during manufacturing, I believe that applying the present invention to a low-cost, high-volume, robust, CMOS manufacturing process is a much more cost effective solution.

Returning to FIG. 1, assume that correct operation requires at least 0.1 volt above the actual threshold voltage for adequate on-current drive and at least 0.05 volt below the actual threshold voltage to guarantee low off current. Under those circumstances, the supply voltage could theoretically be reduced to 0.15 volt, if there were no variations in the threshold voltage. With the present invention, after adding enough headroom to the power supply to compensate for all of the variations in the threshold voltages, we arrive at a lower limit, on the order of 0.15 volts, the theoretical value. Because the present invention electronically compensates for variations in threshold, it can approach the theoretical limit while standard manufacturing approaches would have to add $V_T$ variations to the 0.15 volts—requiring over 0.5 volts for current state of art. As finer geometry processes become available, the conventional lower limit may increase as a result of greater variations in the threshold voltages.

The architecture of the present invention dramatically extends the endurance of portable computation and communication devices by requiring substantially less energy per unit computation (a.k.a. less power/M-operation/second). Specifically, the proposed method can decrease by 100–1000 times the energy dissipated per transition per logic gate output relative to a conventional 5 volt CMOS logic circuit. I believe that that is more than an order of magnitude lower power than could be achieved by straightforward voltage scaling techniques. In applications where the power requirements are dominated by digital logic, the present invention can extend the field lifetime of portable devices up to 1,000 times. I also believe that the proposed invention can lower the power requirement of analog circuit functions, but to a more modest degree, perhaps on the order of ten times.

Figure 6:
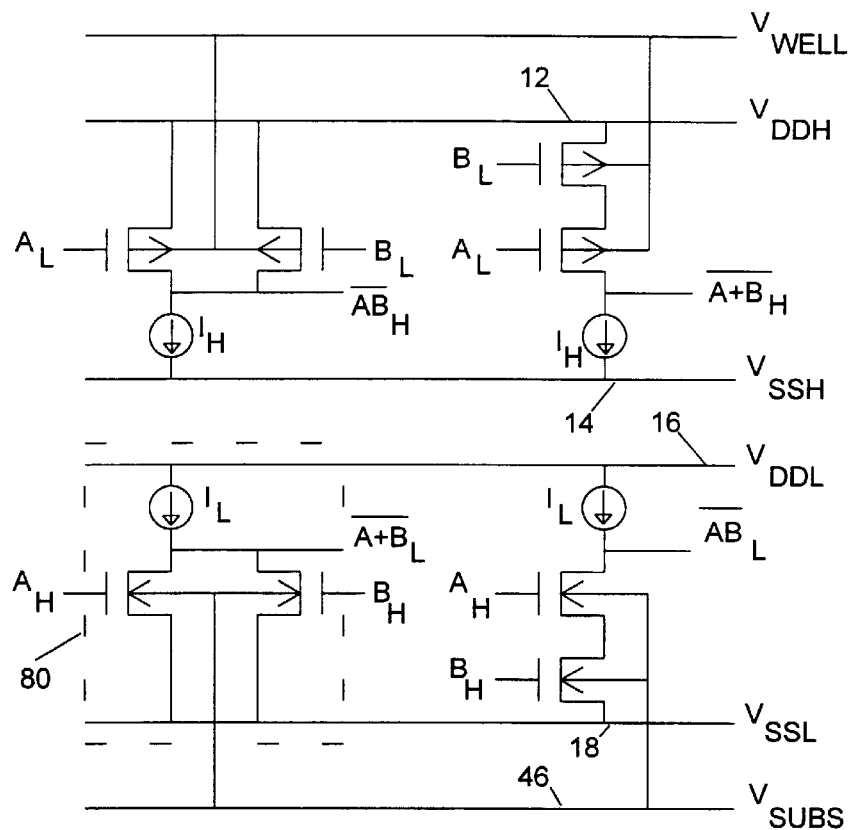
FIG. 6 is an example of some simplified basic logic circuits utilizing the architecture of the present invention.

Turning now the FIG. 4, the inverter 10 illustrated in FIG. 2 is implemented in FIG. 4. In FIG. 4, the current source 32 is implemented by a transistor 62 while the current source 42 is implemented by a transistor 64. The "pseudo-NMOS" inverter made up of transistors 34 and 64 illustrates how logic gates can be constructed. NAND and NOR functions can be implemented by placing NMOS devices in series or parallel, respectively, with transistor 34. Two such logic gates, a NOR gate and a NAND gate are illustrated in FIG. 6. Those of ordinary skill in the art will recognize that all of the standard logic gates, and any desired custom circuit, can be constructed using the circuit architecture of the present invention.

In FIG. 4, transistor 64 merely acts as a current source, as illustrated in FIG. 2, whose value is selected to guarantee that the total load capacitance can be charged up in the required fraction of a clock cycle. For example, the signal $VB_{1L}$ input on the gate terminal of the transistor 64 may be on the order of −0.75 volts to −2 volts. The signal $VB_{2H}$ input to the gate terminal of the transistor 62 provides a similar function of setting the value of the current source and may assume a value of 2 volts to 3.5 volts.

This "pseudo-NMOS" style has the advantage that the input capacitance of the gate is reduced to the input capacitance of only a single device rather than two devices as in standard CMOS static logic. However, the drawback to the present approach is that power does not decrease with circuit latency. Whenever transistor 34 is on, current will be drawn through the circuit. That can be partially mitigated when the application makes it possible to know when a gate output will be idle such that the current source in that gate can be decreased to a "hold" value that is much lower than its "operating" value.

An interesting feature of the architecture resulting from the present invention is that not all outputs can be tied to all inputs. As is seen, the output signal $OUT1_L$ from transistor 34 swings between the value of rails 16 and 18, e.g., 0.25 and 0 volts. The output signal of components connected across rails 12 and 14 swings between the voltages carried by those rails, e.g., 1.0 and 1.25 volts. Thus, the signal $OUT1_H$ swings between 1.25 and 1.0 volts. Note, for clarity, any logic signal in the figures with an "L" subscript swings between $V_{DDL}$ and $V_{SSL}$ and any logic signal with an "H" subscript swings between $V_{DDH}$ and $V_{SSH}$ with the "L" and the "H" distinguishing between the "low-side" and "high-side" of the circuit, respectively. A low-side output must be tied to a PMOS input and a high-side output must be tied to a NMOS input. Because the fundamental gate formed by transistor 34 is inverting, it is impossible to start with a low-side logic signal X and convert it into a low-side logic signal $\overline{X}$. For that reason, it is necessary to add one special "follower" circuit 66 illustrated in FIG. 4.

The follower circuit 66 is comprised of two series connected PMOS transistors 68 and 70 connected across rails 12 and 14. The transistor 68 acts as a constant current source. Its value is set by an input signal $VB_{3H}$ in a manner similar to that previously described in conjunction with the signal $VB_{1L}$. Transistor 70 receives at its gate terminal the output signal $OUT1_L$. The follower circuit 66 produces an output signal $OUT1_H$. Because the follower has a gain substantially less than one (0.5 to 0.8), its output swing will not be full rail-to-rail. Its output should be buffered immediately with a normal gate and should only drive a single load.

It is recognized that the PMOS transistors 68 and 70 will be fabricated in a well separate from the well of the other p-type transistors. Thus, it is necessary to generate a separate well voltage $V_{WELL2}$ to bias that well. The signal $V_{WELL2}$ can be produced using the concepts illustrated in conjunction with FIG. 3 but using a reference circuit matched to transistors 68 and 70 and connecting the inverting input terminal of the operational amplifier to the reference circuit output.

Because of the tremendous economic burden required to modify a fabrication process, qualify the modified process, and track variations in the modified process, each application must "pay" for the overhead of developing and maintaining its own special fabrication process. Because it is unlikely that product niches, such as the one filled by the present invention, will justify the expense of process developing in the near term, it is necessary for the architecture of the present invention to be fabricated using standard CMOS fabrication techniques. Illustrated in FIG. 5 is a view of the substrate carrying the circuitry illustrated in FIG. 4. As can be seen from FIG. 5, the circuitry of FIG. 4 can be implemented using standard CMOS fabrication techniques. Thus, no overhead is encountered in implementing the circuit architecture of the present invention. It should also be noted that although the present invention has been illustrated in the environment of n-type wells in a p-type substrate, the entire circuit could be reversed by beginning with an n-type substrate in which p-type wells are formed.

Figure 7:
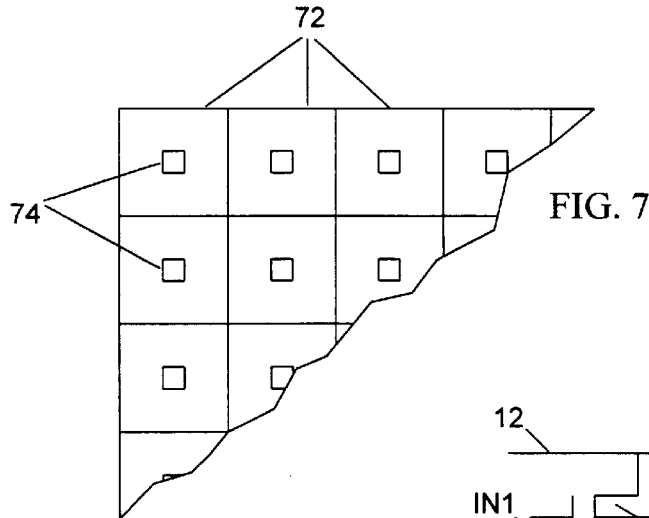
FIG. 7 illustrates the architecture of the present invention used on a large chip.

The circuit architecture of the present invention can be applied at two different levels of threshold offset adjustment: local-area adjustment and die-level adjustment. Die-level adjustment would use the same values for $V_{SSH}$ and $V_{WELL}$ across the entire die. That would only offset some of the systemic variations in $V_{TN}$ and $V_{TP}$ across the wafer, but is it would offset all of the variations between runs. Local-area adjustment would divide the die up into smaller regions (e.g., 100 1 mm×1 mm regions) 72 in FIG. 7. In each region 72, the values for $V_{SSH}$ and $V_{WELL}$ would be determined by a local circuit 74 of the type illustrated in FIG. 3. To guarantee voltage range compatibility, only the outputs from the substrate device gates should be distributed between regions 72. For example, for an n-type well process, the output swinging from $V_{SSL}$ to $V_{DDL}$ should be distributed between regions because the value of $V_{SSH}$ varies between regions. That would also hold true for interconnections between different integrated circuits.

The four rail architecture of the present invention represents a substantial advance over the prior art. The four rail architecture allows supply voltages to be set close to the theoretical minimum value for such voltages. DC current flows only between rails 12–14 and between rails 16–18. No DC current can flow from the first pair of rails to the second pair of rails because they are connected only by the gates of transistors which cannot pass DC current. Also, the various bias voltages needed for the wells, substrates, and current sources draw little or no power and so can be generated easily by switched capacitor DC-to-DC converters. By providing appropriate bias voltages to the substrate and the wells, variations in threshold voltages can be compensated which enables the power supply voltages to be set close to the minimum theoretical value. It is important to note that although the architecture of the present invention results in the substantial advantages previously discussed, the architecture of the present invention can be fabricated using standard, commercially available, CMOS fabrication techniques.

In an economic sense, a company must see a large market/profit potential before modifying or developing new, specialized, fabrication processes. The cost to bring even a relatively simple fabrication process into volume production is currently on the order of $250,000,000 rising to over $1,000,000,000 for complex process. At the current time, the low power market may not be large enough to justify custom process development. Hence, the ability of the present invention to be implemented using standard CMOS fabrication techniques is a substantial advantage.

Circuits constructed using the architecture of the present invention can be operated across a wide range of points on the speed-power curve simply by adjusting the internal power supply and bias voltages. Thus, a circuit constructed according to the present invention can be operated at low speed and ultra-low power. Then, with a change in only the bias voltages, the exact same circuit can be operated at medium speed and power. One can easily imagine a lap top computer which idles at a low clock speed when waiting for input and then switches to a high clock speed when executing a program.

CLASS B CONSIDERATIONS

Those of ordinary skill in the art will recognize that the circuits described thus far are Class A circuits. That is, I have described circuits which always dissipate constant power whenever there is a logic high output. As expected, with the four rail architecture of the present invention, improvements in power savings occur at low clock frequencies. To improve the performance of the four rail architecture of the present invention at higher clock frequencies, it is possible to combine a circuit constructed according to the teachings of the present invention with a Class B buffer, i.e., with a buffer that only dissipates power when active. I also disclose a methodology for implementing the four rail architecture of the present invention to create a Class B circuit.

Figure 8:
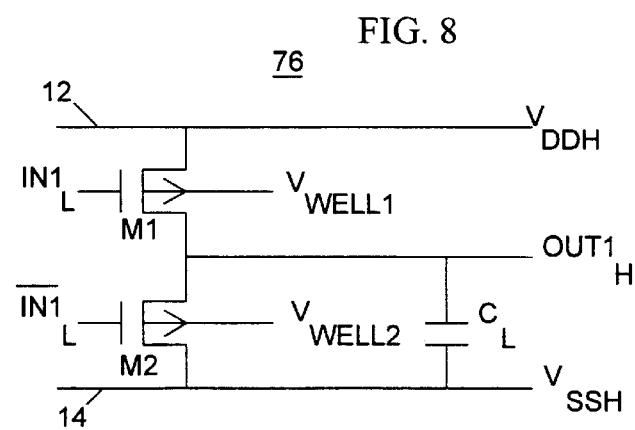
FIG. 8 illustrates a Class B buffer circuit which may be used in combination with circuits designed using the four rail architecture of the present invention.

When driving a capacitive load, the size of the current source is determined by the maximum allowed propagation delay. However, for nodes that only switch on a small fraction of the possible clock edges, that is very wasteful of power. Therefore, I have also developed a Class B four rail driver/buffer 76 for driving capacitive loads as shown in FIG. 8. Like static CMOS, either M1 is on and M2 is off or vice versa. No static power is dissipated by the Class B buffer 76 except for leakage currents, just like static CMOS. Note, however, that because M1 is operating in common-source mode and M2 is operating in common-drain mode, to make the switching point of the buffer 76 occur at the midpoint of the input swing, the well voltages of M1 and M2 are adjusted separately by area-wide or chip-wide bias generators. In addition, both the true and complement of any signal to be buffered must be available.

Figure 9:
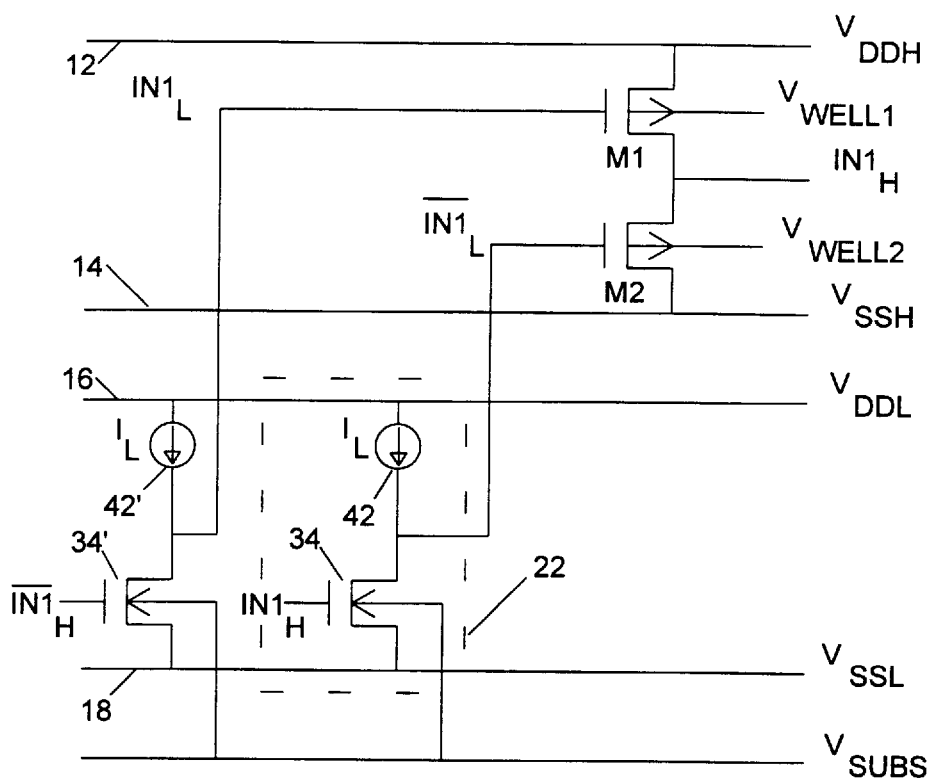
FIG. 9 illustrates one of the inverters shown in FIG. 2 connected to a Class B buffer circuit of the type shown in FIG. 8.

FIG. 9 illustrates one of the inverters 22 shown in FIG. 2 connected to the Class B buffer circuit 76 of the type shown in FIG. 8. Because the complement of the signal to be buffered must be available, it is necessary to add a transistor 34' and a current source 42' to provide the necessary signal.

Figure 10:
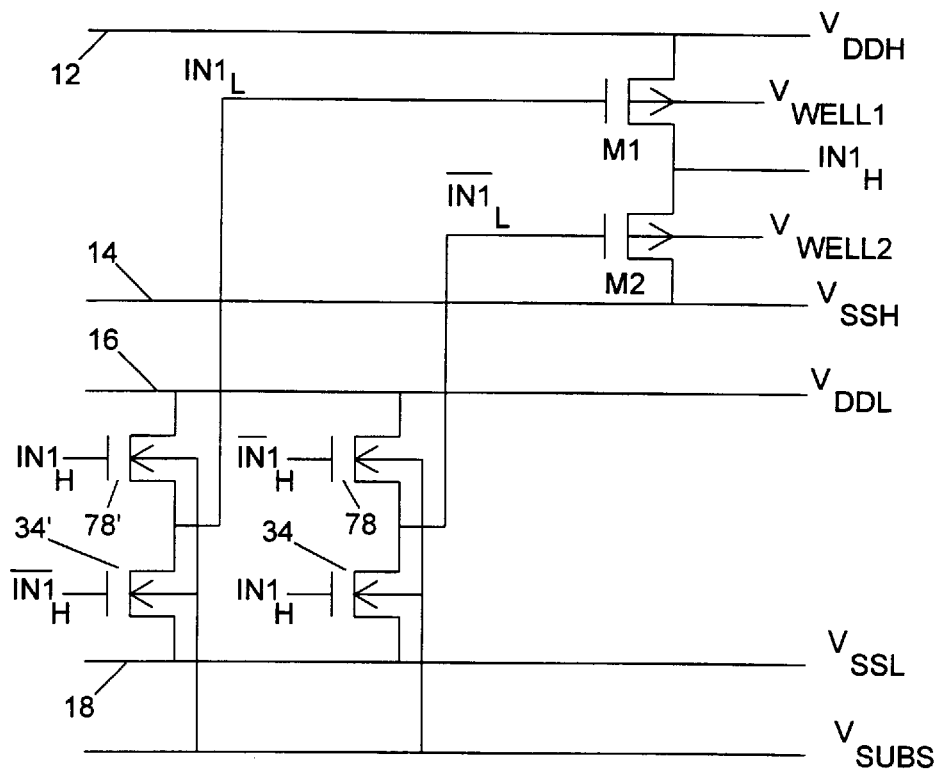
FIG. 10 illustrates how the inverter shown in FIG. 9 may be implemented using the four rail architecture of the present invention to create a Class B inverter.

The design philosophy underlying the buffer 76 may be extended to design Class B circuits using the four rail architecture of the present invention. For example, in FIG. 10 we see that the current source 42' shown in FIG. 9 has been replaced by a transistor 78' which is responsive to the complement of the signal input to transistor 34'. Because the transistors 78' and 34' are responsive to the true and complement, respectively, of the same signal, power is dissipated only during switching. Similarly, the current source 42 has been replaced by transistor 78 so that power is dissipated by those transistors only during switching. Thus, while the circuit shown in FIG. 9 may be viewed as a Class A/B circuit, the circuit shown in FIG. 10 is a Class B/B circuit. The "penalty" paid to achieve a Class B/B circuit is essentially a doubling of the number of transistors needed to perform the logic function of interest.

It is important to note that in FIG. 10, transistors 34', 78', 34, and 78 are all located on the same substrate such that adjustment of the well potential as was done with transistors M1 and M2 is not possible. Under such conditions, it is known to ratio the widths of the transistors to compensate for differences in gain caused, for example, by different modes of operation. Thus, in FIG. 10 the width of transistor 34 is greater than the width of transistor 78 and the width of transistor 34' is greater than the width of transistor 78'. Appropriate ratios may be arrived at by running simulations seeking the largest possible noise margins. Of course, combinations of ratioing and control of well potential may also be used where appropriate. The reader desiring more information about ratioing components is directed to "The Design And Analysis Of VLSI Circuits" by Glasser and Dobberpuhl, 1985.

Figure 11:
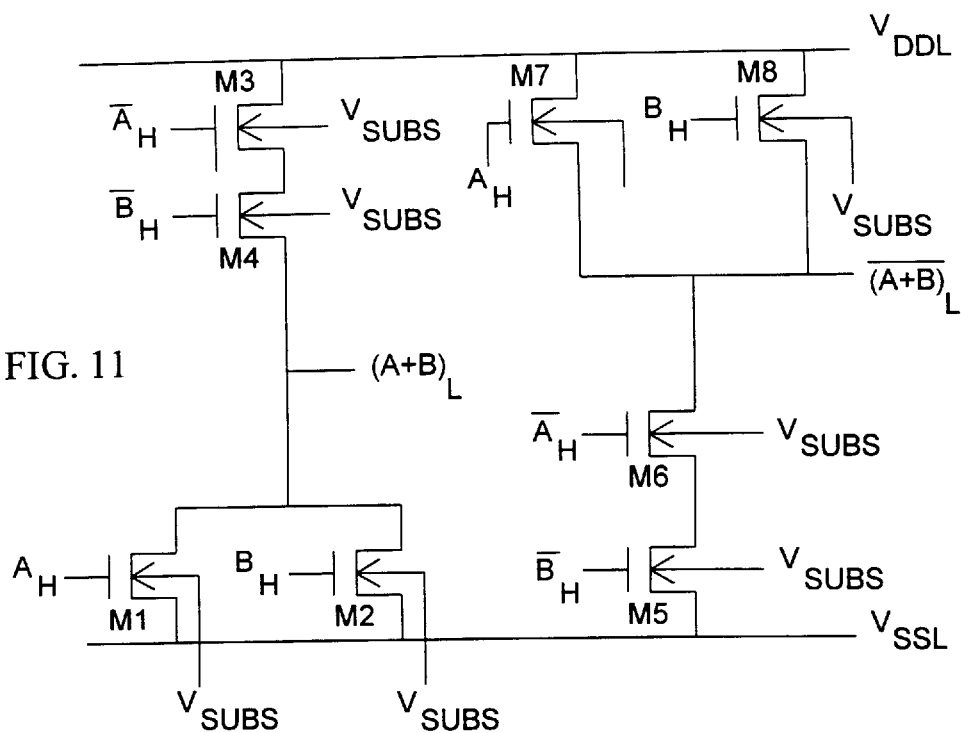
FIG. 11 illustrates how a portion of the basic logic circuits of FIG. 6 may be implemented using the four rail architecture of the present invention to create a Class B logic circuit.

Finally, to illustrate the concept that any Class A circuit using the four rail architecture of the present invention may be implemented as a Class B circuit by essentially doubling the number of transistors so as to provide the complement of every signal, the Class A NOR gate implemented by the components within box 80 of FIG. 6 is shown implemented as a Class B NOR gate in FIG. 11. In FIG. 11, the transistors M5 and M6 provide the same function as the two transistors within box 80 of FIG. 6. The current source shown in box 80 in FIG. 6 is replaced in FIG. 11 by transistors M7 and M8 for the reasons previously discussed. The transistors M1, M2, M3, and M4 are provided to generate the true version of the signal produced by transistors M5, M6, M7, and M8.

I have analytically compared the achievable power dissipation of static CMOS logic with the four rail architecture disclosed herein and the four rail architecture disclosed herein in conjunction with a Class B buffer. I compared the power dissipation of static CMOS and four rail circuits operating at equal clock frequency. The choice of power supply voltage ($V_{DD}$ for convenience is the same as $V_{SUP}$ for four rail circuits) is optimized for each circuit design approach separately. Although it is not always possible to adjust $V_{DD}$ arbitrarily, that assumption is still useful in order to make the comparison as fair as possible. Therefore, the goal in this section is to compute expressions for the minimum possible $V_{DD}$ for both four rail architecture and CMOS in order to operate at a given frequency and to compute the power dissipation at that operating point and frequency.

First we need approximate expressions for the delay of static CMOS logic, four rail logic, and four rail logic with Class B drivers. If we assume that the input undergoes its full swing instantly and we define the delay as the time for the output to cross the mid-point, then $$\text{DELAY(CMOS)} = \frac{C_L V_{DD}}{2\beta (V_{DD} - V_T)^2}$$

where $$\beta = \frac{\mu C_{ox} W}{2L}, C_L$$

is the total capacitive load driven by the gate, and $V_T$ is the inherent threshold voltage of the device turning on. Note, $V_T$ cannot be arbitrarily reduced in a CMOS process for many reasons; e.g., subthreshold leakage, manufacturing variations, and spread in delays. Typical minimum threshold for a standard 0.5 $\mu L_{eff}$ CMOS process is 0.5V. In addition, the manufacturing variations in $V_T$ are expected to get worse as channel lengths get shorter. For this analysis, we will assume that $V_T=0.5V$. In order to relate a gate delay to the clock operating frequency we need to know the worst-case number of gate delays between latches—we will refer to this as M. Typical values of M range from 4 to 12 depending on the architecture of the system. Using M, we can solve for the minimum $V_{DD}$ that will support a given clock frequency, $f_{clk}$ $$V_{DD-CMOS} V_T + \frac{V_F}{2} + \sqrt{V_F \left( V_T + \frac{V_F}{4} \right)}$$

where $$V_F = \frac{M f_{clk} C_L}{2\beta}$$

Finally, to get the power dissipation of static CMOS logic we can plug this value of $V_{DD}$ into the standard equation $$\text{POWER(CMOS)} = \lambda f_{clk} C_L V^2_{DD}$$

where $\lambda$ is the "latency" of the gate. For CMOS operating at low clock frequencies, we can see that this expression reduces to $$\text{POWER(CMOS)} = \lambda f_{clk} C_L V^2_T$$

Next for the four rail architecture, the delay is $$\text{DELAY(QR)} = \frac{C_L V_{DD}}{2 I_B}$$

where $I_B$ is the value of the bias current source. At first it may appear that there is no relationship between the choice of $V_{DD}$ and the choice of $I_B$, which if true would mean any delay could be achieved at any $V_{DD}$ just by increasing the current. However, the minimum $V_{DD}$ is determined by the required noise margin. A simple equation can be derived by assuming that the difference between $V_{DD}$ and $V_{OH}$ or $V_{IH}$ is a fixed fraction of $V_{SUP}$. Similarly, the difference between $V_{SS}$ and $V_{OL}$ or $V_{IL}$ is a fixed fraction of $V_{SUP}$. Assuming the transistor is in the strong inversion region this gives $$I_B = \beta \left( \frac{\alpha}{2} V_{DD} \right)^2$$

where $\alpha$ is a constant that depends on the selected fixed fractions. For example, if $V_{OL}-V_{SSH}=V_{SUP}/6$ and $V_{DDH}-V_{IH}=V_{SUP}/3$ then $\alpha=0.222$. Combining these together and assuming M delays in a clock period gives a minimum power supply voltage for four rail architecture of $$V_{DD-QR} = \frac{2}{\alpha^2} V_F$$

combining this with the equation for the power of four rail architecture, and assuming that on average half of the outputs are low and half are high, $$\text{POWER(QR)} = \beta \left( \frac{V_F}{\alpha} \right)^2 \left( \frac{1}{\alpha^2} V_F \right) = \frac{\beta V_F^3}{\alpha^4}$$

At low frequencies it is clear that four rail architectures scale much better (cubically) than does standard static CMOS logic (linearly).

Figure 12:
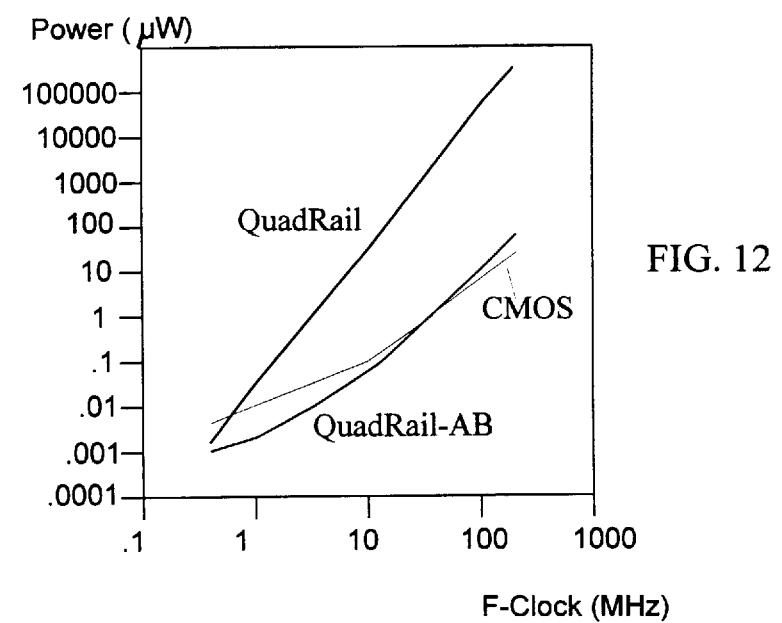
FIG. 12 is a graph illustrating a plot of power dissipation versus clock frequency for CMOS circuits, Class A four rail circuits, and Class A/B four rail circuits.

Finally, four rail architecture with a Class B output stage has a component of both of the above expressions. However, the static power dissipation expression uses $C_B$ the input capacitance of the buffer instead of the $C_L$ to be driven. In many applications $C_B$ is 100 times smaller than $C_L$. The Class B power dissipation is the same as the CMOS expression except that $V_T$ is adjusted by the four rail architecture. In this case $V_T$ is not 0, but a small number to guarantee noise margin and to control off leakage currents—on the order of 0.1V–0.2V. Allowed delay is split between the two stages. Four rail architecture with Class B buffers offers improved voltage scaling over both static CMOS logic and Class A four rail architecture for medium clock speed applications as shown in FIG. 12 wherein M equals 8, $\lambda$ equals 0.2, $\alpha$ equals 0.222, $C_B$ equals 5 fF, $C_L$ equals 200 fF, $\beta$ equals 100 $\mu$A/V$^2$, $V_T$ equals 0.5V, and $V_{T-Buffer}$ equals 0.15V.

To extend the power consumption comparison to include four rail Class B circuits with Class B buffers, again the relevant variable is power at equal clock rates while allowing both CMOS and the four rail architecture variants to choose their own best power supply voltages. When operating in Class B/Class B mode, the minimum is determined by the $V_{DD}$ driving voltage needed by the buffers. The primary saving over Class A four rail logic followed by Class B buffers is that no static power (other than leakage currents) is dissipated. Full advantage of latency is taken. For the particular numbers shown in FIG. 13, the gain is a factor of two in power.

Figure 13:
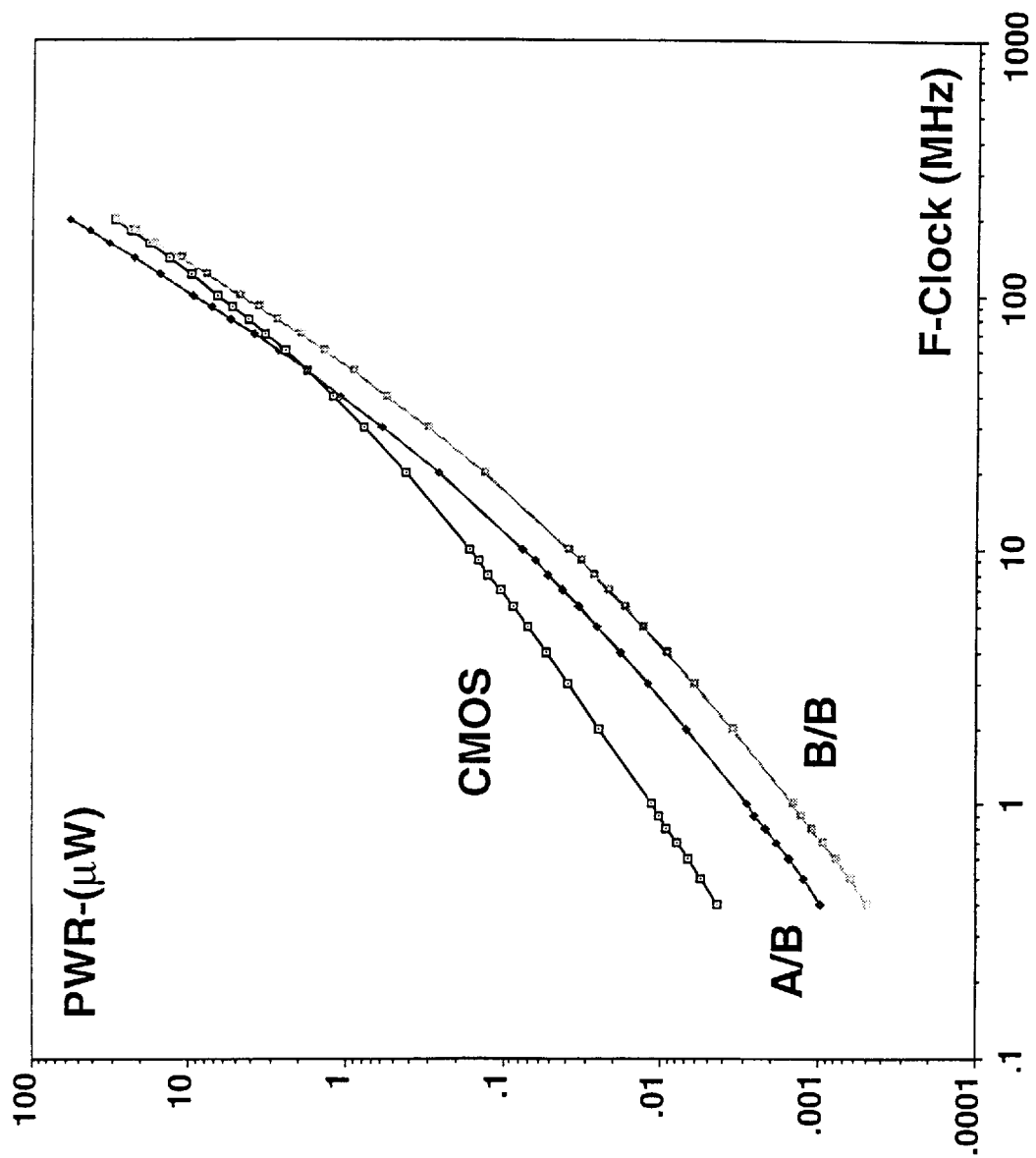
FIG. 13 is a graph illustrating a plot of power dissipation versus clock frequency for CMOS circuits, Class A/B four rail circuits, and Class B/B four rail circuits.

It is clear that all Class B four rail architecture is always as good as CMOS logic, and that it scales better as operating frequency (and power supply voltage) is reduced. An example of the variations in power supply voltage variation with frequency for the same circuits is shown in FIG. 13. Four rail Class B architecture with Class B buffers offers all of the power saving advantages of CMOS plus the ability to better scale down power consumption as the required operating speed is reduced.

While the present invention has been described in connection with a preferred embodiment, many modifications and variations will be apparent to those of ordinary skill in the art. This disclosure in the following claims are intended to cover all such modifications and variations.

What I claim is:

1. A complementary metal oxide semiconductor circuit comprising:

a first plurality of components for producing a first output signal, at least one of said components having a gate terminal, a source terminal, and a drain terminal;

a first pair of voltage rails including a first voltage rail providing a first voltage and a second voltage rail providing a second voltage to said source terminal and drain terminal of said first plurality of components;

a second plurality of components for producing a second output signal, at least one of said components having a second gate terminal, a second source terminal, and a second drain terminal;

a second pair of voltage rails including a third voltage rail providing a third voltage and a fourth voltage rail providing a fourth voltage to said second source terminal and second drain terminal of said second plurality of components; and a plurality of conductors interconnecting said first and second pluralities of components to form a first circuit portion wherein current flows between said first voltage rail and second voltage rail and the value of said first output signal is between said first and second voltages, and to form a second circuit portion wherein current flows between said third voltage rail and said fourth voltage rail and the value of said second output signal is between said third and fourth voltages, with substantially no current flow between said first and second pair of voltage rails.

2. The complementary metal oxide semiconductor circuit of claim 1 additionally comprising circuit means for monitoring the voltage difference across said second voltage rail and said fourth voltage rail for adjusting the value of the voltage carried by said second voltage rail.

3. The complementary metal oxide semiconductor circuit of claim 2 wherein said monitoring and adjusting circuit means includes an inverting amplifier and a current source connected in series across said third and fourth rails, an input terminal of said amplifier is responsive to a signal representative of a midpoint between the voltage across said first and second rails, said monitoring and adjusting circuit means further including an amplifier responsive to an output signal from said amplifier and a signal representative of the midpoint between the voltage across said third and fourth rails to produce an output voltage which is added to said second voltage.

4. The complementary metal oxide semiconductor circuit of claim 2 wherein said first and second pluralities of components are fabricated in a substrate having wells formed therein, and wherein said circuit additionally comprises first bias means for applying a bias voltage to said substrate.

5. The complementary metal oxide semiconductor circuit of claim 4 wherein said substrate is a P-type substrate and said bias voltage applied to said substrate is a negative voltage.

6. The complementary metal oxide semiconductor circuit of claim 4 additionally comprising a second bias means for applying a bias voltage to said wells.

7. The complementary metal oxide semiconductor circuit of claim 6 wherein said second bias means includes an amplifier and a current source connected in series across said first and second rails, an input terminal of said amplifier is responsive to a signal representative of midpoint between the voltage across said third and fourth rails, said second bias means further including an amplifier responsive to an output signal from said amplifier and a signal representative of midpoint between said voltage across the first and second rails to produce an output voltage which is applied to said wells.

8. The complementary metal oxide semiconductor circuit of claim 1 wherein said first circuit portion and second circuit portion each forms an inverter.

9. The complementary metal oxide semiconductor circuit of claim 1 additionally comprising means for generating the complement of said first output signal and means for generating the complement of said second output signal, said circuit additionally comprising a first class B buffer means responsive to said first output signal and said complement of said first output signal, and a second class B buffer means responsive to said second output signal and said complement of said second output signal.

10. The complementary metal oxide semiconductor circuit of claim 9 wherein said first class B buffer means includes first and second transistors connected in series across said third and fourth rails, and wherein said second class B buffer means includes third and fourth transistors connected in a series across said first rail (12) and said second rail.

11. The complementary metal oxide semiconductor circuit of claim 1 wherein said first plurality of components includes transistor pairs series connected across said first and said second voltage rails and which are responsive to the true and complement of the same signal, and wherein said second plurality of components includes transistor pairs series connected across said third and fourth rails and which are responsive to the true and complement of the same signal so as to form a class B metal oxide semiconductor circuit.

12. The complementary metal oxide semiconductor circuit of claim 1 wherein at least one of said components for producing a first output signal has a first threshold voltage, at least one of said components for producing a second output signal has a second threshold voltage, the voltage difference across said first and second rails is less than said first threshold voltage, the voltage difference across said third and fourth rails is less than said second threshold voltage and the voltage offset between said first and second set of rails being greater than said first and second threshold voltages.

* * * * *